(12) United States Patent
Orban (10) Patent No.: US 6,434,241 B1
(45) Date of Patent: Aug. 13, 2002

(54) CONTROLLING THE PEAK LEVELS OF THE FM COMPOSITE SIGNAL BY HALF-COSINE INTERPOLATION

(76) Inventor: Robert A. Orban, 2413 Lincoln Ave., Belmont, CA (US) 94002-1423

( * ) Notice: Subject to any disclaimer, the term of this patent is extended or adjusted under 35 U.S.C. 154(b) by 0 days.

(21) Appl. No.: 09/550,349

(22) Filed: Apr. 14, 2000

Related U.S. Application Data (60) Provisional application No. 60/129,802, filed on Apr. 16, 1999.

(51) Int. Cl.[7] .................................................. H03G 7/00
(52) U.S. Cl. .......................................... 381/106; 455/43
(58) Field of Search .............................. 381/3, 4, 94.8, 381/106; 455/72

(56) References Cited

U.S. PATENT DOCUMENTS 4,103,239 A 7/1978 Meewezen
4,207,526 A * 6/1980 Abt .............................. 455/43
4,207,527 A * 6/1980 Abt .............................. 455/43
4,720,839 A 1/1988 Feher et al.
5,168,526 A 12/1992 Orban
5,579,404 A 11/1996 Fielder et al.
5,864,585 A 1/1999 Erisman
5,913,152 A * 6/1999 Hemphill ...................... 455/43
5,923,768 A 7/1999 Frindle et al.

* cited by examiner

Primary Examiner—Xu Mei
(74) Attorney, Agent, or Firm—Blakely, Sokoloff, Taylor & Zafman LLP (57) ABSTRACT

A method for controlling the peak levels of an FM composite signal is described. First, the FM signal is clipped to obtain an error signal. This signal comprises the "clippings" resulting from the clipping operation. Next, the peaks of the error signal are determined. Then, a half-cosine wave is fitted to each of the peaks. The resultant half-cosine-interpolated signal is filtered to provide a filtered error signal. This error signal is subtracted from the FM composite signal.

9 Claims, 10 Drawing Sheets

CONTROLLING THE PEAK LEVELS OF THE FM COMPOSITE SIGNAL BY HALF-COSINE INTERPOLATION

Priority is claimed to Provisional Application Ser. No. 60/129,802, filed Apr. 16, 1999

BACKGROUND

1. Field of the Invention

The invention relates to the field of controlling peak levels of frequency modulated (FM) signals.

2. Prior Art

Audio signals are frequently clipped at predetermined thresholds particularly in the broadcast field to prevent over-modulation of the transmitter, which is ordinarily defined by government regulations. In many instances, the "clippings" are used in subsequent processing. The use of "clippings" for signal processing is described in U.S. Pat. No. 5,737,434 entitled "Multi-Band Audio Compressor with Look-Ahead Clipper" and U.S. patent application Ser. No. 09/216,345, filed Dec. 18, 1998, entitled "Oversampled Differential Clipper," assigned to the Assignee of the present invention.

When this technology is applied to frequency modulated (FM) composite signal, unexpected difficulties arise in trying to create an FM composite clipper that is bandlimited to 53 kHz and that protects the 19 kHz pilot tone. Filtering the clipped signal causes overshoots greater than 10% modulation and also unduly compromises the stereo separation.

As will the be seen, the present application provides a new, non-linear approach to controlling the composite waveform that greatly ameliorates prior art disadvantages and produces a waveform that overshoots, in worse case, approximately 1.5% and is tightly bandlimited to 53 kHz.

SUMMARY OF THE INVENTION

A method for controlling the peak levels of an FM composite signal is described. First, the FM signal is clipped to obtain an error signal. This signal comprises the "clippings" resulting from the clipping operation. Next, the peaks of the error signal are determined. Then, a half-cosine wave is fitted to each of the peaks. The resultant half-cosine-interpolated signal is filtered to provide a filtered error signal. This error signal is subtracted from the FM composite signal. In one embodiment, the filter includes a notch at approximately 19 kHz. In another embodiment, the FM composite signal is sampled asynchronously with respect to the 38 kHz FM signal and the peaks are found by interpolating between samples and then the 38 kHz half-cosine is fitted to each of the interpolated peaks.

DETAILED DESCRIPTION OF THE PRESENT INVENTION

A method for controlling the peak levels in an FM composite signal using half-cosine-interpolation is disclosed. In the following description, numerous specific details are set forth such as specific clipping depths and frequencies in order to provide a thorough understanding of the present invention. It will be apparent to one skilled in the art that the present invention may be practiced without these specific details. In other instances, well-known techniques such as clippers, samplers, and subtractors are not described in detail in order not to unnecessarily obscure the present invention.

The FM composite signal is applied to a clipper to develop an error signal. This is shown as step 10 in FIG. 1. The error signal is that part of the waveform that is removed by the clipper, the "clippings". The error signal typically consists of a number of spikes, which are likely to be "sliced" segments of the 38 kHz stereo subcarrier.

Figure 1:
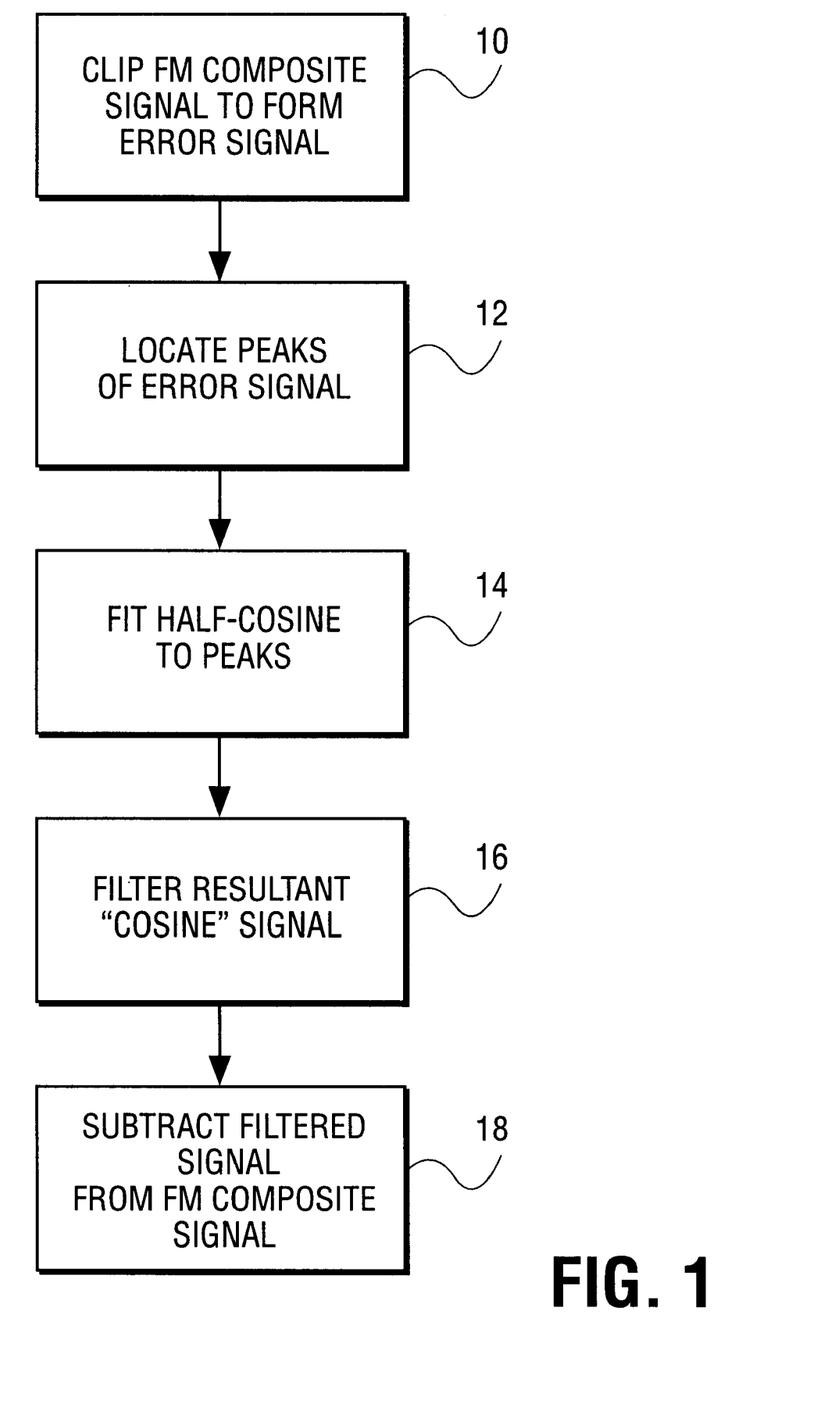
FIG. 1 shows the steps of the present invention.
Figure 2:
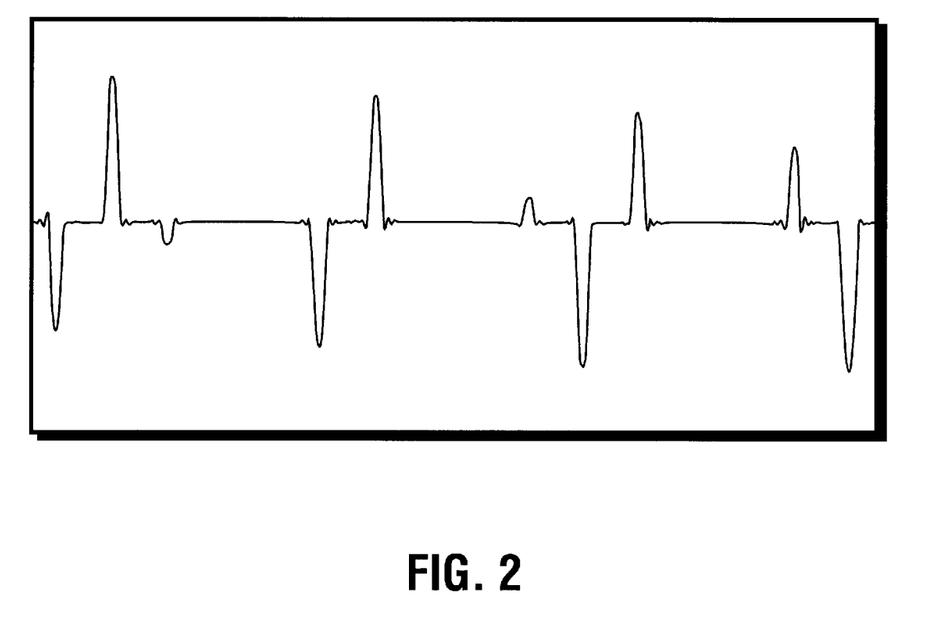
FIG. 2 illustrates the error signal generated from a 15 kHz left-only signal with 3 dB of clipping depth.
Figure 3:
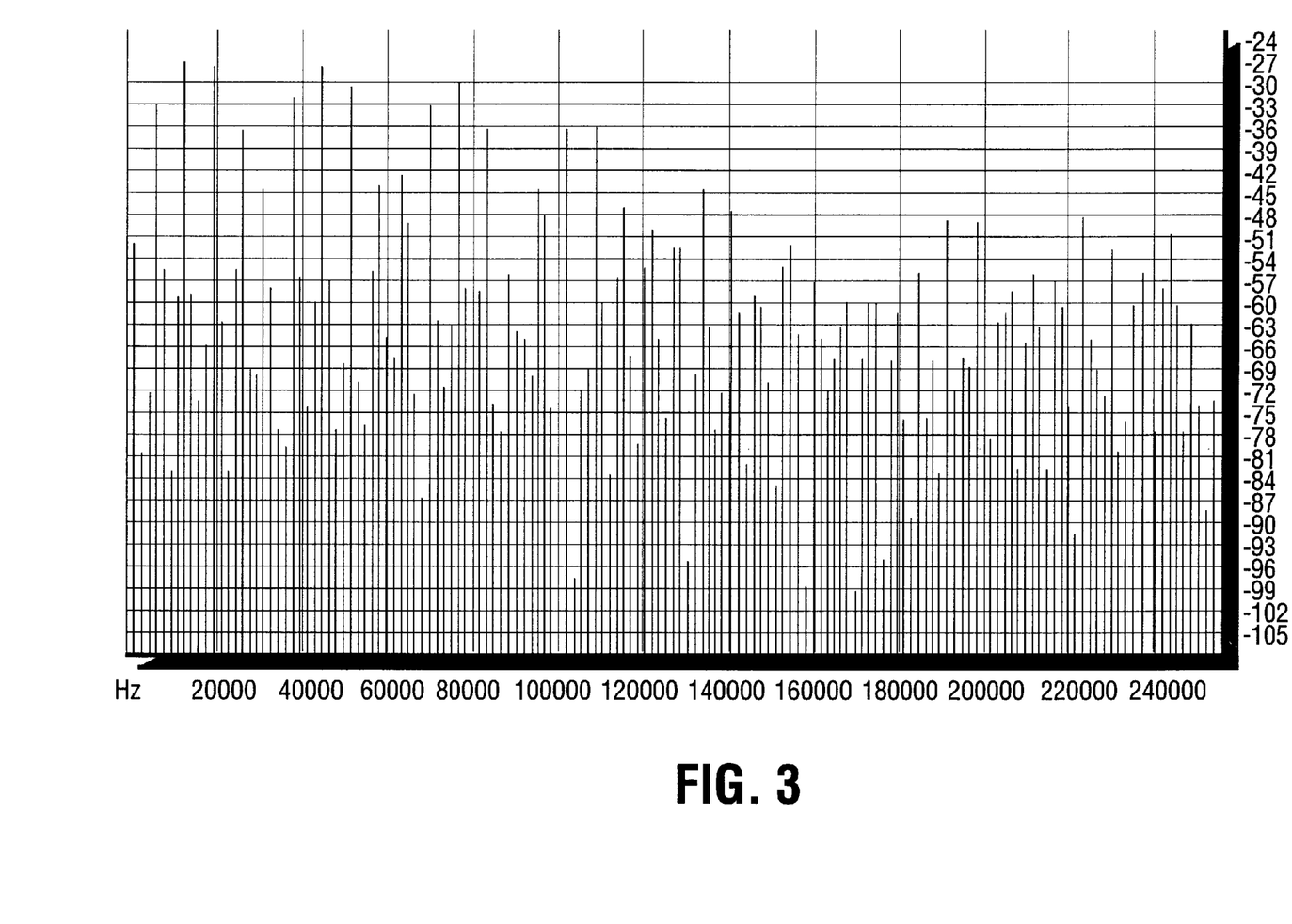
FIG. 3 illustrates the spectrum of the waveform of FIG. 2.

Now the peaks of the error signal are found as shown by step 12 of FIG. 1. FIG. 2 shows such an error signal, generated from a 15 kHz left-only signal with 3 dB of clipping depth. Because the signal is hard-sliced, it contains a considerable amount of high frequency energy that was not present in the original. FIG. 3 shows the spectrum of the FIG. 2 waveform.

Now the peaks of the error signal are found as shown by step 12 of FIG. 1. First, it should be observed that the FM stereo system can also be considered to be a "time division multiplex" system, where the positive and negative peaks of the 38 kHz subcarrier alternately sample the left and right channels. Therefore, it may be concluded that the peak values of the composite waveform are likely to coincide with (or be close to) the peaks of the 38 kHz subcarrier. Using a 608 kHz sample rate (16×38 kHz), it can be seen that one peak of the subcarrier occurs every eight samples. Exactly one-half of the 38 kHz cosine wave also takes up exactly eight samples.

Starting at a peak of the 38 kHz subcarrier, the time axis is stepped along every eight samples in sync with the peaks of the subcarrier. At each peak test the eight adjacent samples are tested (four on either side of the peak) to find the highest absolute value of all samples, including the one on the subcarrier peak. This gives the values for each sample corresponding to a subcarrier peak that is a value representing the highest absolute value of that peak and its immediate neighbors.

Figure 4:
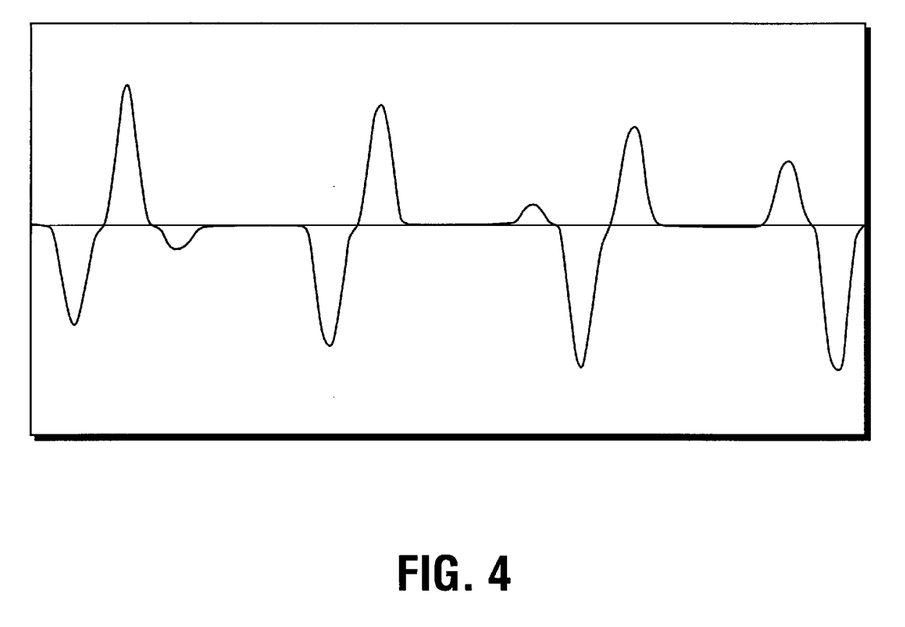
FIG. 4 illustrates the waveform with the interpolated half-cosine functions fitted to the peaks.

Now a half-cosine of 38 kHz is fitted between each of the peaks (using the maximum absolute values), so that one end of the half-cosine wave coincides with the earlier subcarrier peak and the other end of the half-cosine wave coincides with the next subcarrier peak, eight samples later. This splices one half-cosine wave to the next. This is shown as step 14 of FIG. 7. Because the first derivative of a cosine wave is zero at 0 radians and n radians, the resulting wave is not only continuous but also has a continuous first derivative. The resulting interpolation, shown in FIG. 4, is far smoother than the original in FIG. 2. Its spectrum, shown in FIG. 5, also shows far less high frequency energy, as might be expected from the fact that the first derivative is continuous and the dominant spectral component is likely to be 38 kHz.

The formulas for doing this are quite simple. Starting with a table of 16 values corresponding to a 38 kHz-cosine wave sampled at 608 kHz, it is noted that the maximum value of −1 occurs at sample #1 and the minimum value of −1 occurs at sample #9. Let "a" be the value of the first peak of the 38 kHz subcarrier and let "b" be the value of the subsequent peak. To fit the half-cosine wave, each sample between the subcarrier peaks are computed as follows:

$$\text{sample} = \text{offset} + \text{scale}\left(\cos 2\pi\left[\frac{\text{sample\_number}-1}{16}\right]\right)$$

$$\text{offset} = \frac{a+b}{2}$$

$$\text{scale} = \frac{a-b}{2}$$

Figure 5:
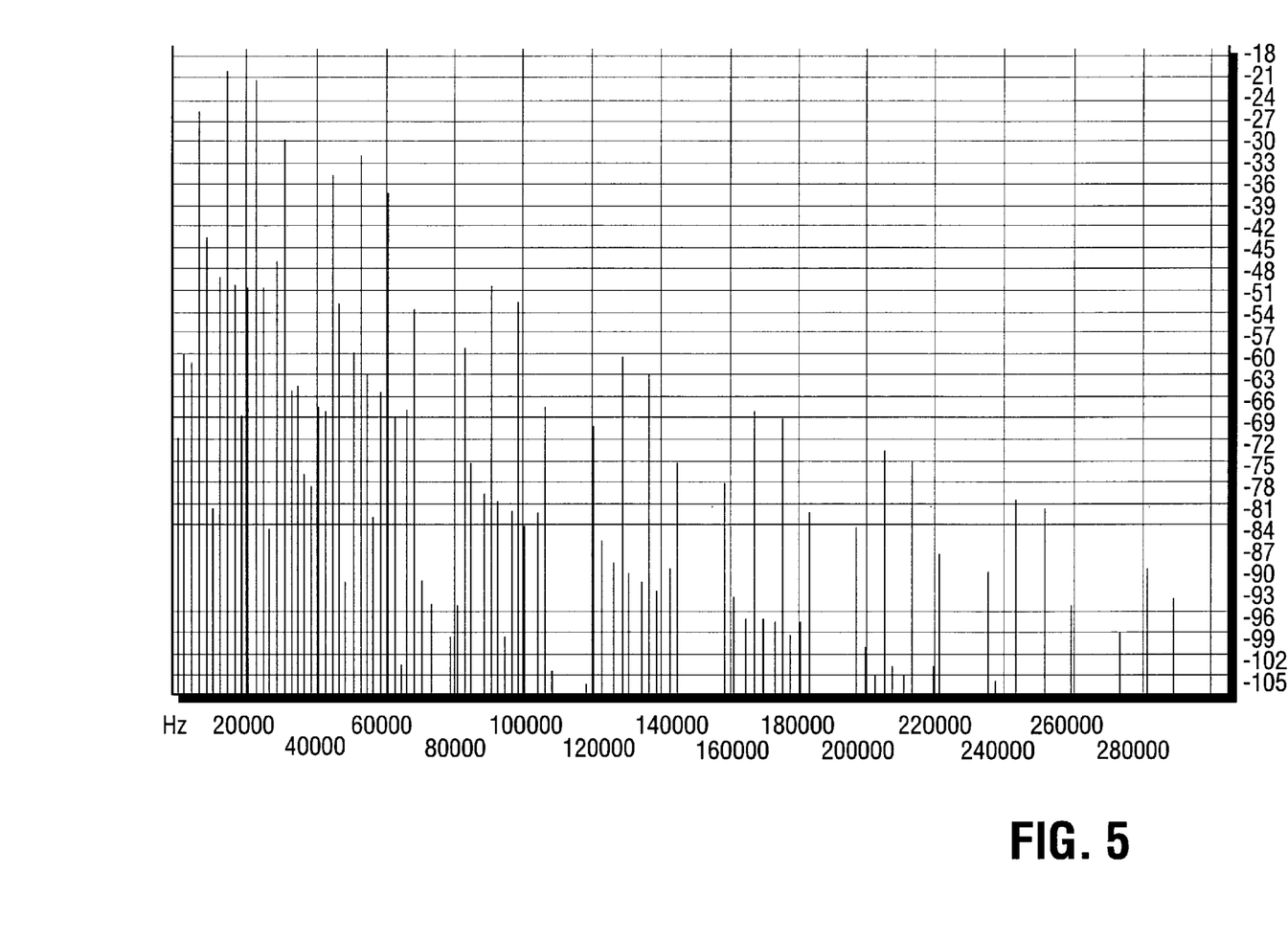
FIG. 5 illustrates the spectrum for the waveform shorn in FIG. 4.

The smaller amount of energy above 53 kHz as shown by FIG. 5, by comparison to the uninterpolated case provides the impetus to apply a 53 kHz lowpass filter to the error signal without significantly changing its peak level (because the energy removed is small). This is step 16 of FIG. 1.

Figure 6:
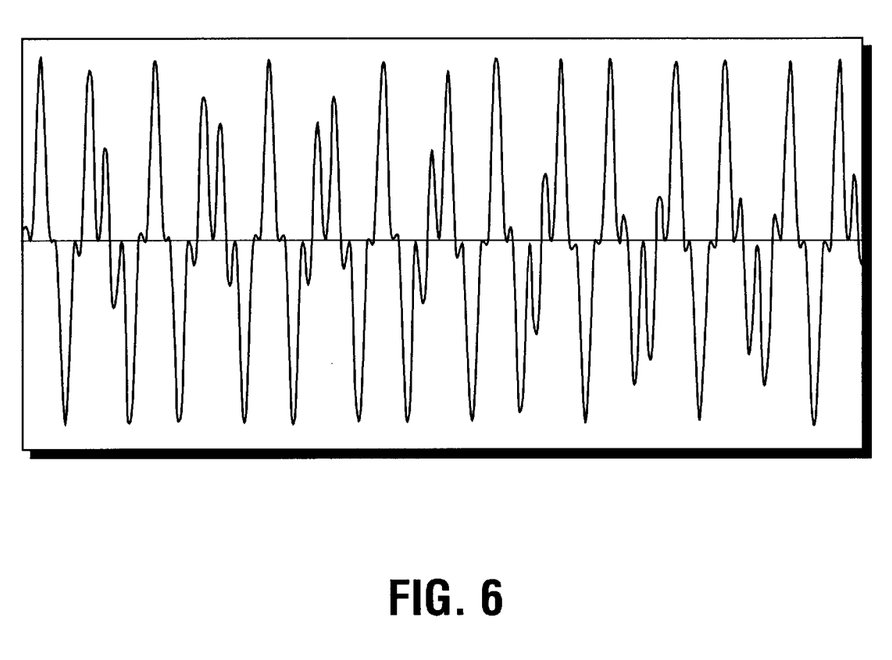
FIG. 6 illustrates the waveform of the peak-controlled output.
Figure 7:
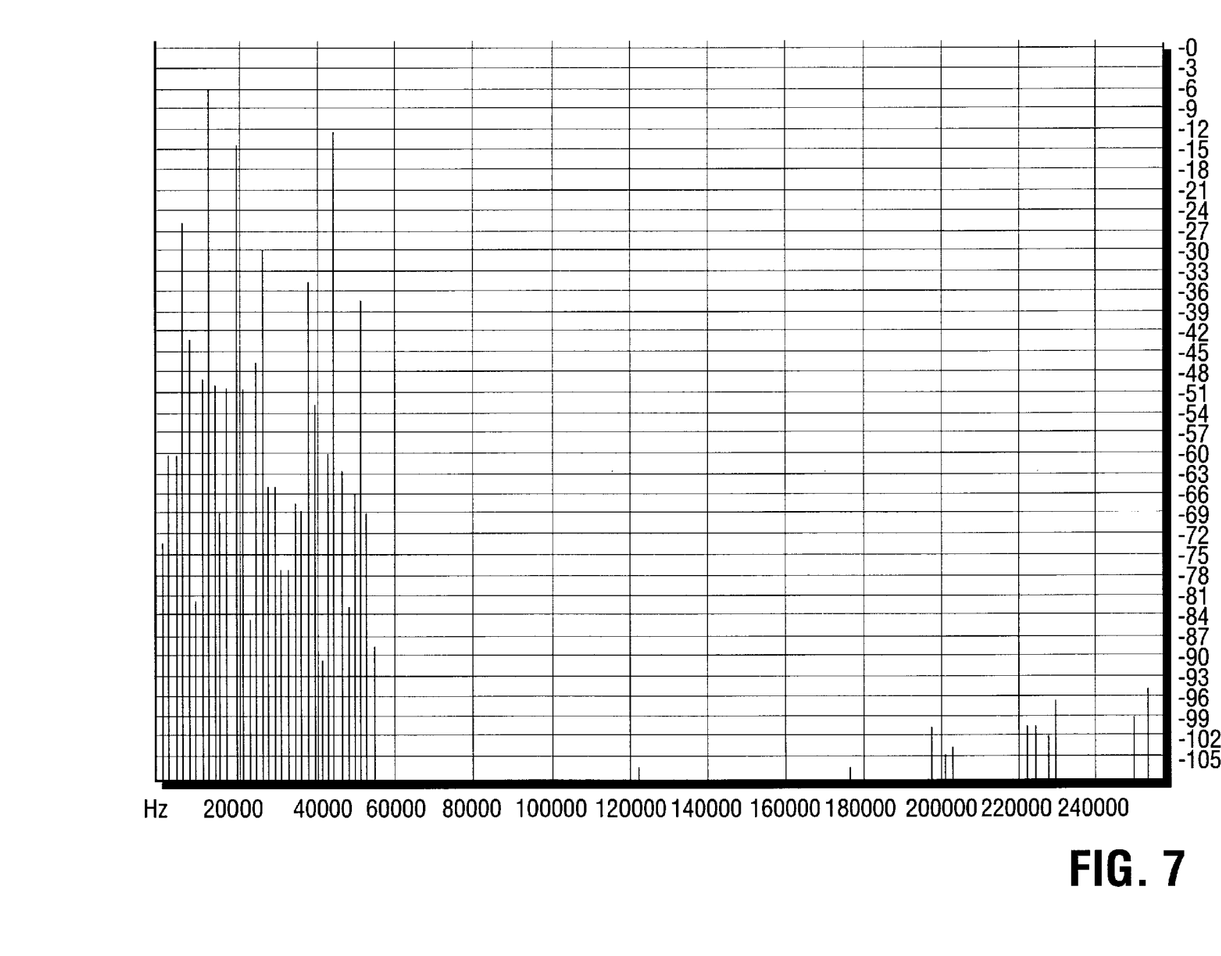
FIG. 7 illustrates the spectrum of the waveform of FIG. 6.

After subtracting the filtered error from the original unclipped signal to produce the peak-controlled output signal (step 18 of FIG. 1), the added overshoot is only 0.11 dB by comparison to a signal that is hard-clipped with no output filtering. FIG. 6 shows the waveform of the peak-controlled output. FIG. 7 shows its spectrum.

Figure 8:
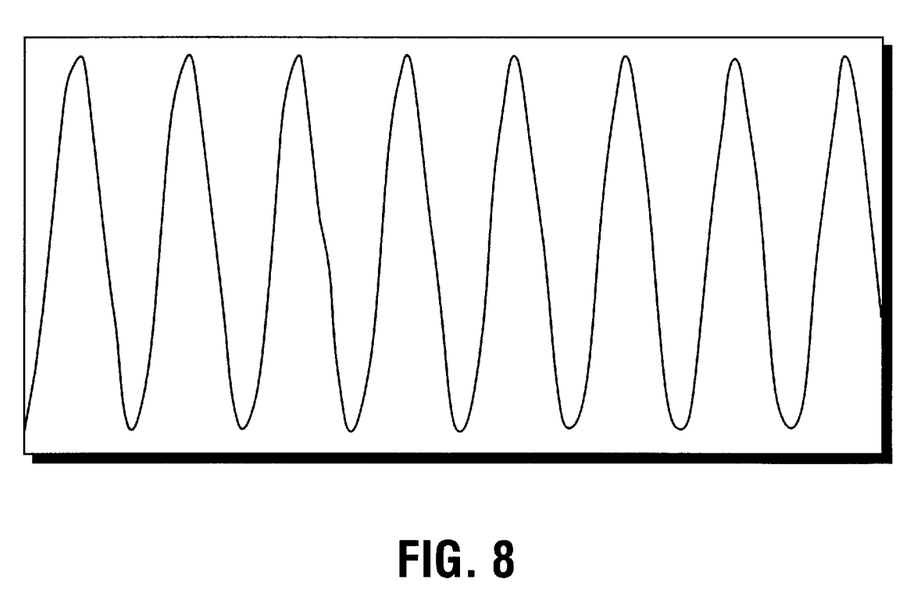
FIG. 8 illustrates the waveform at a 15 kHz L+R signal with 3 dB of clipping.
Figure 9:
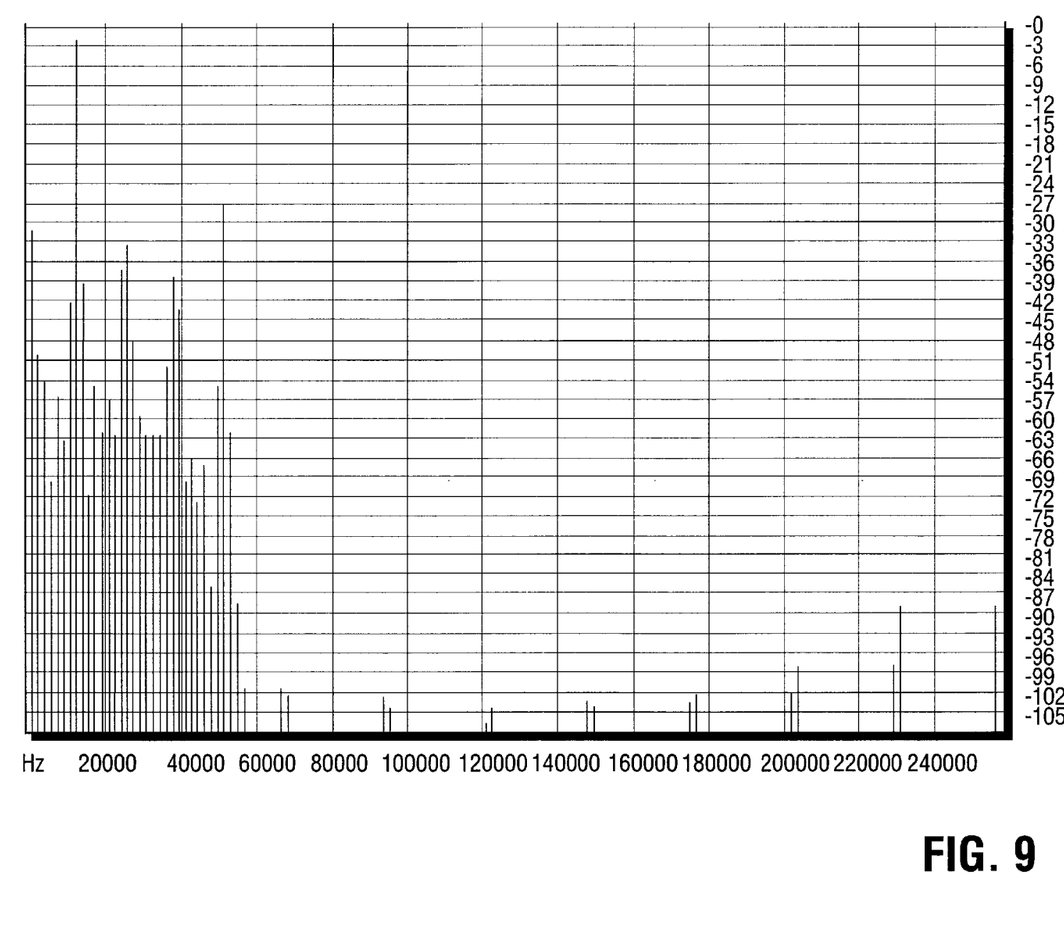
FIG. 9 illustrates the spectrum for the waveform of FIG. 8 after 53 kHz lowpass filtering.

Because the half-cosine interpolation method assumes that the error signal is sliced 38 kHz cosine waves, it is important to examine its operation when the error signal contains no 38 kHz energy. This will be true for any pure L+R signal. FIG. 8 shows the waveform of a 15 kHz L+R signal with 3 dB of clipping, and FIG. 9 shows its spectrum (after 53 kHz lowpass filtering). Overshoot performance is excellent since overshoot is 0.16 dB, which is far lower than it would be if the wave were hard-clipped and then filtered at 53 kHz. The spectrum is quite complex, then 45 kHz third harmonic dominates. However, there is a difference frequency IM tone at −32 dB at approximately 1 kHz, and a tone at approximately 26 kHz at −34 dB.

All tones between 23 and 53 kHz alias back into the 0 to 15 kHz band after passing through a receiver's stereo decoder. However, it should be pointed out that a hard-clipped 15 kHz sinewave would have a much higher third harmonic (at 45 kHz) of approximately −11 dB, and this would alias to 7 kHz in a radio's stereo decoder. Accordingly, none of the spectral products produced by the half-cosine method are nearly as strong as the aliased third harmonic would be in the conventionally clipped case.

Figure 10:
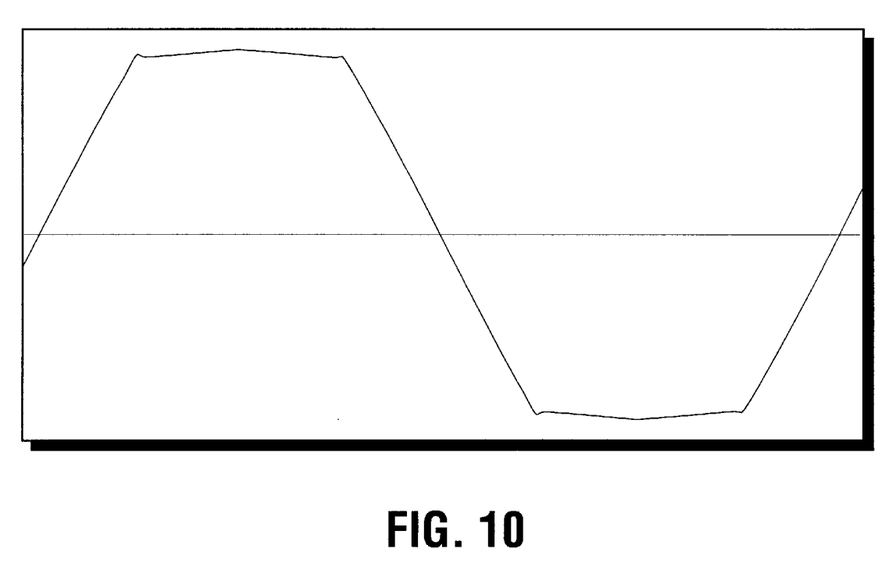
FIG. 10 illustrates the waveform for a 1 kHz tone.
Figure 11:
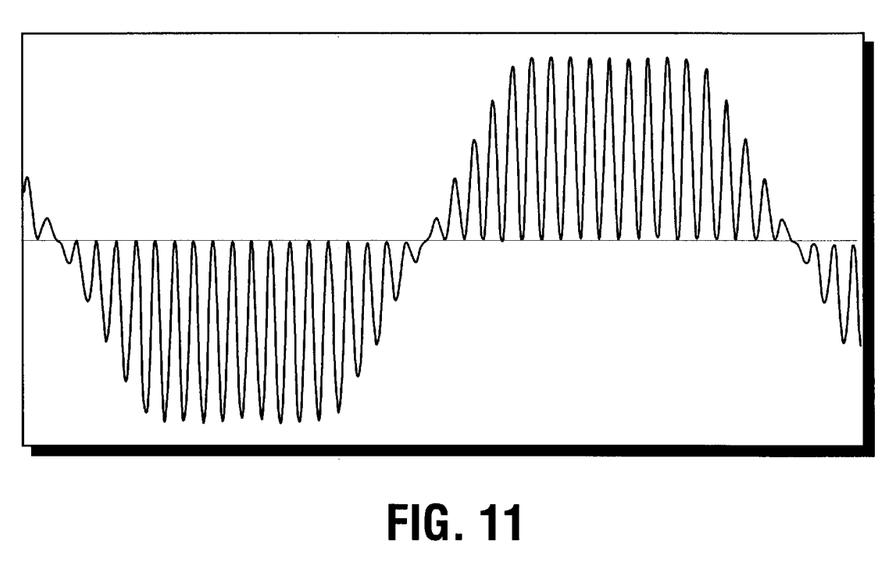
FIG. 11 illustrates the waveform for a 1 kHz left-only tone.

FIG. 10 shows the 1 kHz tone waveform when compared to the 1 kHz left-only waveform of FIG. 11. Particularly notable is the fact that the baseline of the left-only tone does not "lift" off the baseline, as it does in the case of conventional clipping plus filtering.

The behavior of the method of the present invention has been examined with program material, encoded in the left channel only, with the right channel being silent. This was done using a 53 kHz lowpass filter with and without a 19 kHz notch filter with a stopband ±1 kHz from 19 kHz. The performance without the notch filter is excellent since overshoot is 0.15 dB maximum. However, introducing the notch causes the overshoot to increase to 0.60 dB. Obviously, the narrower the stopband of the notch, the less effect it will have on the overshoot. Therefore, a 250 Hz notch is a good compromise between overshoot and pilot protection.

The table below indicates the maximum overshoot in dB for three cases: (1) no additional lowpass filtering, (2) 53 kHz lowpass filtering only, and (3) 53 kHz lowpass filter plus 19 kHz notch filtering with a ±1 kHz wide stopband.

TABLE 1

Half-Cosine Clipping-dB Overshoot for 3 dB Clipping

| Material | No filter | 53 kHz only | 53 kHz + 19kHz |
|---|---|---|---|
| 15 kHz left-only | 0.11 dB | 0.08 dB | 0.93 dB |
| 12 kHz left-only | 0.10 dB | 0.08 dB | 0.10 dB |
| 10 khz left-only | 0.10 dB | 0.13 dB | 0.12 dB |
| 5.5 kHz left-only | 0.04 dB | 0.04 dB | 0.52 dB |
| 15 kHz L + R | N/A | 0.16 dB | N/A |
| 5.5 kHz L + R | N/A | 0.02 dB | N/A |
| Program material, left only | N/A | 0.15 dB | 0.62 dB |

The simulation used filters designed for 512 kHz sample rate, but operated at 608 kHz. This made the band edges of the filters slightly inaccurate. However, it did not have any material effect on the accuracy of the overshoot calculations.

The invented method is substantially more complex to use at 512 kHz-sample rate because the samples are no longer synchronized with single cycles of 38 kHz. Nevertheless, it is still possible to use the invented method by observing that, at 512 kHz-sample frequency, samples of a 38 kHz-cosine wave repeat in frames of 19 cycles, each containing exactly 256 samples.

For all but two cycles in the wave within one frame, the peak of the wave does not coincide with a sample. A method was developed using three-point Lagrange interpolation that approximates the peak value of a wave from three samples in which the center sample has a higher absolute value than its outliers.

There are either six or seven samples contained in each half-cycle of the subcarrier. The peak detection algorithm must examine each sample in the composite waveform to ensure that it does not miss any samples. By convention, three samples were examined ahead in time with reference to the peak of the subcarrier. Because there are either six or seven samples in each half-cycle, either three or four samples backward in time from each peak should be examined. The method developed for using half-cosine interpolation at 512 kHz replies on a precomputed table with 38 lines—one for each peak of the subcarrier except for the very first peak, which is coincident with the last peak in the preceding frame. (There are 38 cycles and 39 peaks in each frame.) The table's index is the serial number of the peak, starting with 1. Each row in the following table (Table 2) contains the serial number of the sample immediately before the subcarrier peak. It also carries the number of samples (3 or 4) over which to search backwards from the peak to determine the highest absolute sample value. (As stated earlier, searching forward by 3 samples is required.)

TABLE 2

| Index of subcarrier peak | Index of sample Immediately below peak | # samples between this peak and previous peak | # samples to search below peak |
|---|---|---|---|
| 0 | 0 | 0 | 3 |
| 1 | 6 | 6 | 3 |
| 2 | 13 | 7 | 4 |
| 3 | 20 | 7 | 4 |
| 4 | 26 | 6 | 3 |
| 5 | 33 | 7 | 4 |
| 6 | 40 | 7 | 4 |
| 7 | 47 | 7 | 4 |
| 8 | 53 | 6 | 3 |
| 9 | 60 | 7 | 4 |

TABLE 2-continued

| Index of subcarrier peak | Index of sample Immediately below peak | # samples between this peak and previous peak | # samples to search below peak |
|---|---|---|---|
| 10 | 67 | 7 | 4 |
| 11 | 74 | 7 | 4 |
| 12 | 80 | 6 | 3 |
| 13 | 87 | 7 | 4 |
| 14 | 94 | 7 | 4 |
| 15 | 101 | 7 | 4 |
| 16 | 107 | 6 | 3 |
| 17 | 114 | 7 | 4 |
| 18 | 121 | 7 | 4 |
| 19 | 128 | 7 | 4 |
| 20 | 134 | 6 | 3 |
| 21 | 141 | 7 | 4 |
| 22 | 148 | 7 | 4 |
| 23 | 154 | 6 | 3 |
| 24 | 161 | 7 | 4 |
| 25 | 168 | 7 | 4 |
| 26 | 175 | 7 | 4 |
| 27 | 181 | 6 | 3 |
| 28 | 188 | 7 | 4 |
| 29 | 195 | 7 | 4 |
| 30 | 202 | 7 | 4 |
| 31 | 208 | 6 | 3 |
| 32 | 215 | 7 | 4 |
| 33 | 222 | 7 | 4 |
| 34 | 229 | 7 | 4 |
| 35 | 235 | 6 | 3 |
| 36 | 242 | 7 | 4 |
| 37 | 249 | 7 | 4 |
| 38 | 256 | 7 | 4 |

Entries 19 and 38 are special cases because the peak of the subcarrier exactly coincides with a sample. This means that the "look ahead in time" and "look backward in time" sample groups share one time-coincident sample that occurs on the subcarrier peak. Therefore, for these two cases only the "look backwards in time" sample count is reduced by 1. Entry 0 is also a special case because it is on the border of the preceding frame and is the same of sample 38 of the preceding frame. The results are copied from sample 38 of the previous frame into the "entry 0" position.

Fortran 90 code to generate this table is:

```
INTEGER: :Peaks(0:38.4)
Peaks (0,1) =1
Peaks (0,2) =0
Peaks (0,3) =0
Peaks (0,4) =3
Peaks (1,1) =128
Peaks (1,2) =128/19
Peaks (1,3) =6
Peaks (1,4) =3
DO i=2,38
    Peaks(i,1) =128*i
    Peaks(i,2) =(i*128)/19
    Peaks(i,3) =Peaks(i,2 -Peaks( (i-1),2)
    IF (Peaks(i,3) ==6) THEN; Peaks(i,4) =3; ELSE; Peaks(i,4) =4;
    ENDIF
END DO
```

The problem remains of determining the peak value of the unclipped waveform at the exact peaks of the subcarrier when no sample exists at a given peak. This is solved by Lagrange interpolation, the mathematical derivation of which is provided at the end of this application. The samples are examined that straddle the peak of the subcarrier and determine if either peak is larger in magnitude than its neighbors, forming a "head and shoulders" pattern. If it is, a simple formula is applied to find the peak value:

$$\text{peak\_value} = \frac{0.125(y_1 - y_{-1})^2}{2y_0 - y_1 - y_{-1}} + y_0$$

where −1, 0, and 1 are the indices of the three adjacent samples. (Below, for convenience $y_{-1}$ is call $y_n$.) As in the 608 kHz version of the algorithm, an adjacent sample is scanned before and after the subcarrier peak (according to Table 2) to determine the largest magnitude sample adjacent to each peak. The interpolated peak is included in the scan if a "head and shoulders" pattern emerges. When finished, a table of 39 peak values results (including one copied from the previous frame).

A table of 256 samples must be generated representing 19 full cycles of the subcarrier. This table is used to generate the stereo subchannel (by repeatedly stepping through the table and multiplying the L-R signal by the resulting samples). The indices in this table are the same as the indices in the second column of Table 2. The subcarrier table is used not only to generate the stereo subchannel but also to generate the half-cosine waves that is used for interpolation. By synchronizing stepping through the subcarrier table with stepping through Table 2, it is, ensure that the half-cosine waves used in the interpolation are synchronous with the waves used to generate the stereo subchannel. It is important to code this carefully to ensure that there are no offsets between the two.

Fortran 90 code to generate this table is:

```
REAL(4) : :PilotArray(0:511), SCArray(0:255)
REAL(4) ,PARAMETER: : (step=2.*3.141592654*(19000./512000.) )
! Generate 19kHz sinewave array at 512kHz sample rate
PilotArray(0) =0.
DO i=1, 511
PilotArray(i) =PilotArray(i-1)+step
ENDDO
! Generate 38kHz sinewave array at 512kHz sample rate
PilotArray=COS(PilotArray)
DO i=0,255; SCArray(i)=PilotArray(i*2); ENDDO ! get 38kHz cosine wave
```

After it has been determined the peak value at each of the 38 index points in Table 2, pairs of adjacent peak values are taken and used for computing the offset and scale factors according to Equation (1). These are then applied to the sample indices shown in the second column of Table 2. For example, once the offset and scale factors have been computed for the pair of peaks located at indices 10 and 11 in Table 2, they are applied to samples 68 through 74 of the subcarrier table. Now the existing samples in the differentially clipped signal are replaced with these new samples which represent spliced-together, half-cosine waves, just as in the 608 kHz case.

Fortran 90 code to generate this table is:

```
! ControlImag is array of 2**19 points containing the error signal
! Scan error signal to find peak values; substitute found peak value for original value
at peak of 38kHz wave
interp=0.
nointerp=0.
indextest=0 ! initialize
PeakValue(38) =ControlImag(1) ! initialize peak value as first sample in file
DO i=0, NPT-257, 256 ! step through file in 256-sample frames
! copy peak value of end of previous frame to start of new frame
       PeakValue(0) =PeakValue(38)
! examine each 38kHz peak within 256-sample frame (there are 39 peaks, but the end peaks
            ! are coincident with the end peaks of adjacent 256-sample frames)
      DO j=1, 38, 1
           amin=10000.; emax=-10000.
           m=i+Peaks(j,2)+1 ! this is the index of our location in ControlImag
           DO k=m+1-Peaks(j,4),m+3, 1
! k is sample number re 512kHz; scan samples to determine peak value
                  amin=MIN(ControlImag(k) ,amin)
                  amax=MAX(ControlImag(k) ,amax)
           END DO !k
! Here we do Lagrange peak interpolation
           ! detect if sample close to peak of 38kHz is a peak itself; i.e. *head and
Shoulders: , ˆ,*
           IF (   (ABS(ControlImag(m)))>(ABS(ControlImag(m-1))) .AND.
*        (ABS(ControlImag(m)))>(ABS(ControlImag(m+1))) ) THEN
                  aLagrange=ControlImag(m)+0.125*(ControlImag(m+1)-
*             ControlImag(m-1) ) **2
*             /(2.*ControlImag(m)-ControlImag(m-1)-ControlImag(m+1) )
interp=interp+1.
           ELSE IF ( (ABS(ControlImag(m+1)))>(ABS(ControlImag(m))) .AND.
*        (ABS(ControlImag(m+1)))>(ABS(ControlImag(m+2))) ) THEN
                  aLagrange=ControlImag(m+1)+0.125*(ControlImag(m+2)
*             -ControlImag(m) )**2
*             /(2.*ControlImag(m+1)-31 ControlImag(m)-ControlImag(m+2))
interp=interp+1.
           ELSE
                  nointerp=nointerp+1
                  aLagrange=ControlImag(m)
! there is no peak, so we can't interpolate a peak value
           END IF
           amin=MIN(aLagrange.amin)
           amax=MAX(aLagrange,amax)
           IF (ABS(amin)>ABS(amax)) THEN
                  PeakValue(j)=amin
           ELSE
                  PeakValue(j)=amax
           END IF
           iPeakValueArray=iPeakValueArray+1
           PeakValueArrray(iPeakValueArray)=PeakValue(j)
      END DO ! j
! We now have an array of 38 peak values. We now fit samples of 38kHz half-cosine waves
to these peaks
    slope=-1.
! initialize variable showing slope of half-cosine segment to left of counter
    DO j=0, 37
        offset=0.5*(PeakValue(j)+PeakValue(j+1))
        scale=-slope*0.5*(PeakValue(j)-PeakValue(j+1))
        slope=-1.*slope ! next half cosine has opposite slope from its neighbor
        DO k=Peaks(j,2), Peaks(j+1,2)-1 ! this is samples of one half-cosine wave.
! We step through SCArray 6 or 7 samples at a time from 0 to 255
               LPInputImag(i+k+2)= offset+SCArray(k+1)*scale
' write out interpolation to LFInputImag
        END DO ! k
    END DO !j
END DO ! i
```

Results for the 512 kHz case are not quite as good as for the 608 kHz case, as might be expected from the lower sample rate. Nevertheless, they are satisfactory. Table 3 below shows the overshoot for 3 dB of clipping depth with various sinewave frequencies in both the single-channel and L+R cases. It also shows the results with program material. The percentage of total peaks in which the "head and shoulders" pattern was detected, where the Lagrange interpolation was used. The overshoot has been presented with and without the use of Lagrange interpolation. The interpolation never improves the result by more than 0.04 dB, so the Lagrange interpolation can be considered optional to extract the last bit of performance from the algorithm and can certainly be omitted.

TABLE 3

Overshoot for 3 dB half-cosine clipping depth

| Signal to be clipped by 3 dB | 53 kHz & 19 kHz Filters; Lagrange interpolation | 53 kHz & 19 kHz Filters; no Lagrange | 53 kHz Filter; Lagrange interpolation | % of Peaks using Lagrange interpolation |
|---|---|---|---|---|
| 15 kHz L-on | 0.12 d8 | 0.15 dB | 0.11 d8 | 20.60% |
| 12 kHz L-on | 0.16 dB | 0.20 dB | 0.08 dB | 22.88% |
| 10 kHz L-on | 0.15 dB | 0.16 dB | 0.11 dB | 20.60% |
| 5.5 kHz L-only | 0.48 dB | 0.50 dB | 0.11 dB | 21.75 |
| 15 kHz L + R | 0.39 dB | 0.40 dB | 0.37 dB | 6.868% |
| 12 kHz L + R | 0.09 dB | 0.09 dB | 0.16 dB | 9.155% |
| 10 kHz L + R | 0.14 dB | 0.16 dB | 0.15 dB | 9.155% |
| 5.5 kHz L + R | 0.46 d8 | 0.46 dB | 0.18 dB | 2.28% |
| Program L-only | 0.68 dB | 0.68 dB | 0.24 dB | 2.0% |
| Program L + R | 0.73 dB | 0.73 dB | 0.26 dB | 1.0% |

It is clear that even the ±250 Hz notch bandwidth used in the 19 kHz notch filter is sufficient to cause substantial overshoot due to removal of spectrum in that area. (The 5.5 kHz sinewave is an interesting example of a waveform that produces considerable spectrum that is removed the 19 kHz filter, causing overshoot.) For this reason, one may wish to provide a switch allowing the notch filter to be bypassed.

The method of the present invention with its half-cosine interpolation offers excellent performance in the areas of spectral control and low overshoot. Like any other composite processing, it will cause any spectrum added in the 23–53 kHz region to alias into the 0 to 15 kHz region in the receiver's stereo decoder. The mono listener will not hear this distortion. Secondarily, a certain amount of difference-frequency IM distortion caused by the stereo subchannel energy is likely to appear in the 0 to 15 kHz region, and will be heard on mono receivers as well as stereo receivers. Again, the same thing occurs with conventional clipping. The complexity of the distortion spectrum in the L+R case may be a cause for concern, and this will have to be determined by listening tests.

The method works ideally at sample rates that are power-of-two-multiples of 38 kHz. As shown, a sample rate of 512 kHz works satisfactorily. Optimizing performance at 512 kHz requires use of Lagrange interpolation to estimate the actual peak values. However, this improvement is small and can be eliminated with little or no effect. Because the present invention does not "flat-top" waves between 5 kHz and 15 kHz, it appears to one skilled in the art that a sound brighter than controlling the modulation in the audio domain is not apparent. In this instance, it is dissimilar from "classic" composite clipping. To determine if the new technique is advantageous over left/right-domain clipping use of three-point Lagrange interpolation testing is required.

Lagrange Interpolation

Three adjacent sample, $y_n$, $y_0$, and $y_1$, the Lagrange interpolation is:

$$an_1 yn + a_0 y_0 + a_1 y_1 \qquad (10)$$

$$an_1 := 0.5\alpha(\alpha-1) \qquad (20)$$

$$a_0 := 1-\alpha^2$$

$$a_1 := 0.5\alpha(\alpha+1)$$

where

Substituting eq. (20) into eq. (10), yielding $$-0.5(\alpha^2(2y_0-y_1-yn)+\alpha(yn-y_1)-2y_0) \qquad (30)$$

Differentiating eq. (30) determines the peak with respect to $\alpha$:

$$d/d\alpha(-0.5(\alpha^2(2y_0-y_1-yn)+\alpha(yn-y_1)-2y_0))=-0.5(2\alpha(2y_0-y_1-yn)-y_1+yn) \qquad (40)$$

Set the right hand side equal of eq. (40) to 0 and solve for $\alpha$:

$$-0.5(2y_0-y_1-yn)-y_1+yn=0) \qquad (50)$$

The resulting value of $\alpha$ at the peak is:

$$\alpha = \frac{0.5(y_1 - yn)}{2y_0 - y_1 - yn} + y_0 \qquad (60)$$

Substituting the peak value of a (the right-hand-side of eq. (60) into eq. (30). The result of the substitution is the peak value of the interpolation:

$$\text{peak value} = \frac{0.125(y_1 - yn)^2}{2y_0 - yn} + y_0 \qquad (70)$$

This formula is valid whenever a group of three samples is found where the absolute value of the center sample is larger than the absolute value of each of its neighbors. If this is not the case, the three samples do not describe a peak in the curve. When this is true, the formula describes a correction term added to the value of the center sample. If the two outliers are equal, the correction term is zero and the value of the center sample is assumed to be the true peak. In the event they are unequal, the correction term is not zero.

What is claimed is:

1. A method for controlling the peak levels of an FM composite signal comprising the steps of:
   clipping the FM signal to obtain an error signal, the error signal comprising a removed part of the FM signal;
   determining the peaks of the error signal; and
   fitting a half-cosine wave to each of the peaks.

2. The method defined in claim 1 wherein the peak amplitude of the half-cosine wave is approximately equal to the peak amplitude of the error signal.

3. The method defined by claim 1 wherein the FM composite signal is sampled at a clock rate that is an integer multiple of the 38 kHz signal used in forming the FM composite signal.

4. The method defined by claim 2 wherein the sample values of the half-cosine signal are defined by:

$$\text{offset} + \text{scale}\left(\cos 2\pi\left[\frac{\text{sample number}}{n}\right]\right)$$

$$\text{where offset} = \frac{a+b}{2}$$

$$\text{scale} = \frac{a-b}{2}$$

sample number is the index, from 1 to n, of a sample within a table of length n that contains the values of a uniformly sampled 38 kHz cosine wave, and where an "a" and "b" are the amplitudes of consecutive peaks of the error signal.

5. The method defined by claims 2 or 3 including the additional step of filtering the resulting half-cosine-interpolated signal to provide a filtered error signal.

6. The method defined by claim 4 including subtracting the filtered error signal from the FM composite signal.

7. The method defined by claim 5 wherein the filtering comprises lowpass filtering with a cutoff of approximately 53 kHz.

8. The method defined by claim 6 wherein the filtering includes a notch at approximately 19 kHz.

9. The method defined by claim 1 wherein the FM composite signal is sampled asynchronously with respect to a 38 kHz FM frequency and where the peaks are found by interpolation between samples and a 38 kHz half-cosine is fitted to each of the interpolated peaks.

* * * * *